(12) United States Patent
Sakurai

(10) Patent No.: US 7,744,822 B2
(45) Date of Patent: Jun. 29, 2010

(54) MICROCHIP REACTOR

(75) Inventor: Satoshi Sakurai, Tokyo (JP)

(73) Assignee: JEOL Ltd., Tokyo (JP)

(\*) Notice: Subject to any disclaimer, the term of this patent is extended or adjusted under 35 U.S.C. 154(b) by 466 days.

(21) Appl. No.: 11/770,420

(22) Filed: Jun. 28, 2007

(65) Prior Publication Data

US 2008/0003138 A1 Jan. 3, 2008

(30) Foreign Application Priority Data

Jun. 28, 2006 (JP) .............................. 2006-177431

(51) Int. Cl.
*G01N 30/00* (2006.01)
(52) U.S. Cl. ...................... 422/130; 422/68.1; 422/100; 422/103
(58) Field of Classification Search ............... 422/68.1, 422/103, 130
See application file for complete search history.

(56) References Cited

U.S. PATENT DOCUMENTS

| 6,794,197 | B1 * | 9/2004 | Indermuhle et al. | ......... | 422/68.1 |
| 6,870,185 | B2 * | 3/2005 | Roach et al. | .................. | 257/48 |
| 7,128,876 | B2 * | 10/2006 | Yin et al. | .................... | 422/100 |

FOREIGN PATENT DOCUMENTS

JP      S57-75558      5/1982

OTHER PUBLICATIONS

Published Technical Report 2004-502547 of Japan Institute of Invention and Innovation, Apr. 1, 2004.
Jun Kameoka et al., "An Electrospray Ionization Source for Integration With Microfluidics," *Analytical Chemistry*, vol. 74, No. 22, pp. 5897-5901 (2002).
J.H. Walton et al., "A Micromachined Double-Tuned NMR Microprobe," *Analytical Chemistry*, vol. 75, No. 19, pp. 5030-5036 (2003).

\* cited by examiner

*Primary Examiner*—Jill Warden
*Assistant Examiner*—Sharon Pregler
(74) *Attorney, Agent, or Firm*—The Webb Law Firm

(57) ABSTRACT

There is disclosed a microchip reactor capable of being used in research on reaction kinetics. With this microchip reactor, the time (reaction time) elapsed until a measurement is made since mixing of two liquids is variable. The microchip reactor comprises a base portion and a movable portion which have sliding contact surfaces that are in contact with each other. The base portion and movable portion have their respective downstream flow channel portions which meet at an intersection. Different reagents are introduced at the intersection, mixed, and reacted. An opening is formed in the movable portion. A slot is formed in the base portion. The major axis of the slot is in the direction of sliding motion of the movable portion. The position of the intersection where the reagents are mixed is determined by the intersection of the opening and the slot.

12 Claims, 6 Drawing Sheets

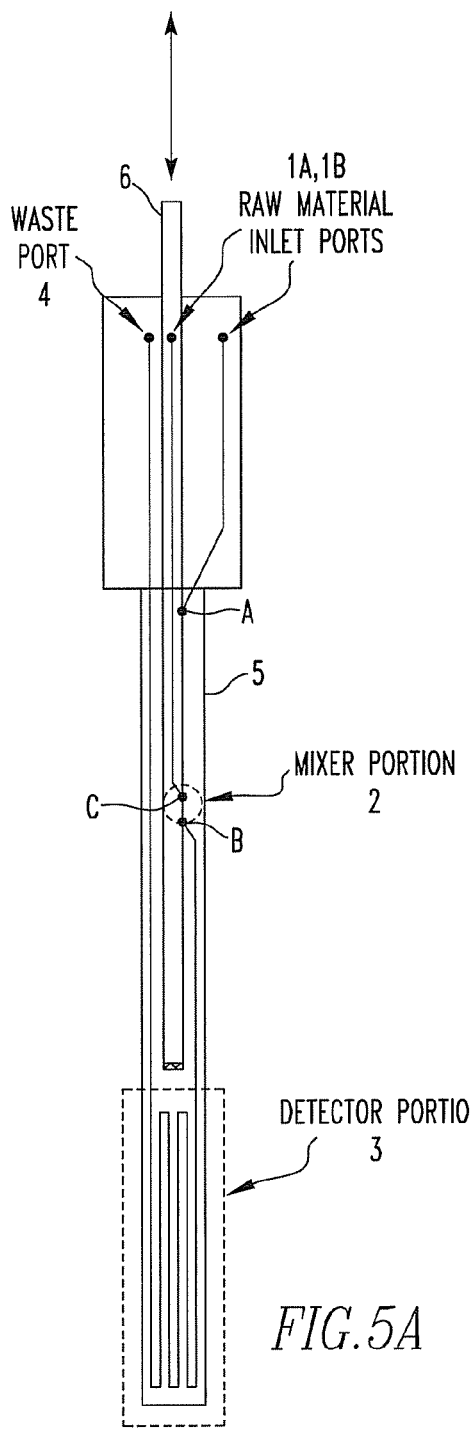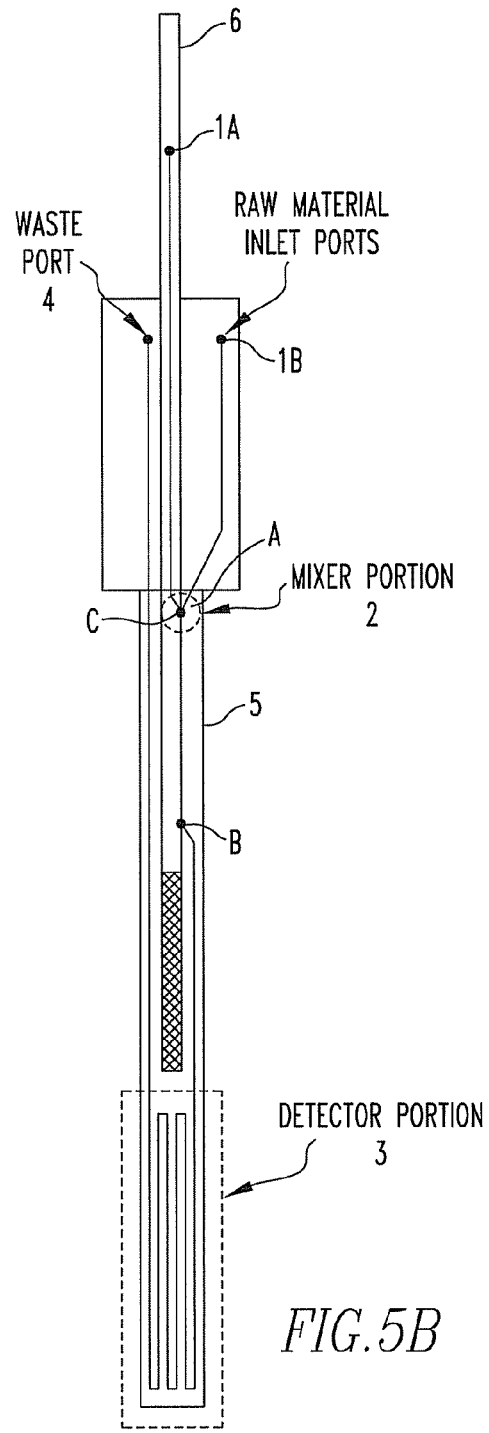

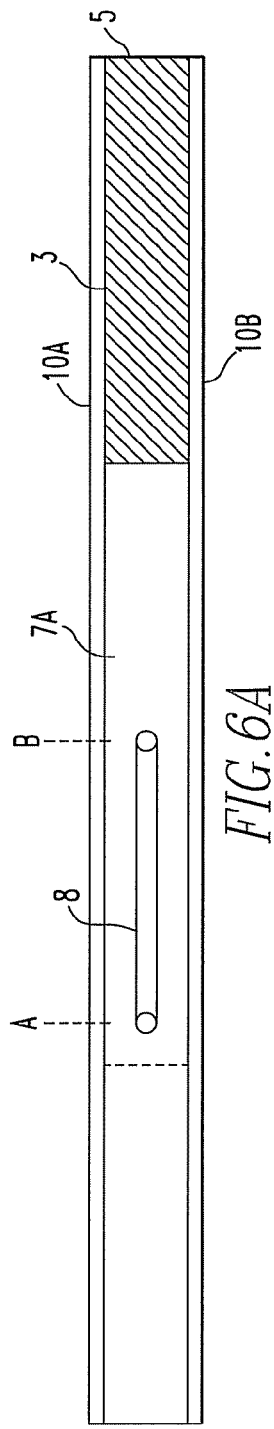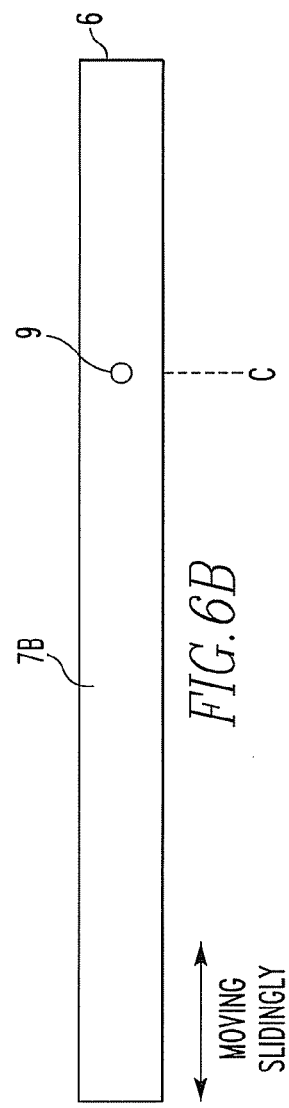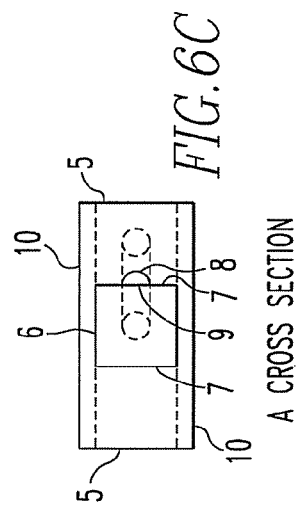

MICROCHIP REACTOR

BACKGROUND OF THE INVENTION

1. Field of the Invention

The present invention relates to a microchip reactor for use in an analytical instrument and, more particularly, to a microchip reactor capable of performing reaction kinetics analysis.

2. Description of Related Art

Technology for mixing and reacting plural substances in a very narrow space is known as microchip technology or microreactor technology. It is expected that this technology will be put into practical use in order to increase the speed of chemical reactions or to enhance the efficiencies of the reactions.

Microchip reactors having microchannels therein used for chemical reactions are often made of glass to have sufficient chemical resistance. However, it is difficult to connect a tube for directly introducing a synthesis reagent into a microchannel of a microchip made of glass. Thus, it is customary that the microchip is held by a holder and then the tube is connected with the holder by a connector.

O-rings are often used to prevent liquid leakage. Substances dissolving out of rubber products and dead volumes often present problems. In one method, an O-ring is bonded to the glass surface with adhesive. However, depending on the used solvent, the adhesive may dissolve out and other problems may take place. Furthermore, a threaded structure used in connecting a tube employed in a liquid chromatograph can be made of glass. Unfortunately, sophisticated skill is necessary to machine the threaded structure of glass, increasing the cost.

In addition, depending on the kind of synthesis reaction, a reagent solution having a high viscosity may be used. After the solution is introduced, the flow passage may be clogged up by the solution. Especially, the passage portions close to the connector tend to be clogged up.

With respect to microchip reactors used for chemical synthesis, some commercial products have been already sold by some manufacturers. The products are chiefly made of glass. A commercially available microchip for the mixing of two reagents is shown in FIGS. 1A, 1B and 1C. The microchip made of glass is composed of two plates. A microchannel is formed in one of the plates (see FIG. 1A). A liquid inlet port and a liquid exit port are formed in the other. The two plates are bonded together by thermocompression.

The microchip is held to a holder (see FIG. 1B). Tubes for introduction of reagents are connected using connectors (see FIG. 1C). The tubes are connected with syringe pumps. Reagent solutions are introduced into the microchip by the syringe pumps. The introduced solutions are made to meet in the Y-shaped portion of the flow channel and are mixed together. The solutions are reacted in the downstream tube portion. Thus, reaction products are synthesized.

A well-known method of detecting reaction products on-line is to use a thermal lens microscope. Where a measurement is made using a mass spectrometer (MS) or a nuclear magnetic resonance spectrometer (NMR) to perform structural analysis of reaction products, the reaction products must be captured at the exit of the microchip. Then, the sample must be introduced into the MS or NMR off-line.

Today, research is being carried out vigorously in an attempt to realize an on-line connection between a microchip or microreactor to which various functions are added and an MS or NMR having excellent qualitative analysis capabilities. The one-line connection is used for analysis. There are the following examples of reports about research.

(1) Microchip-NMR

As shown in FIG. 2, a circular liquid reservoir is formed on a flow channel in a microchip. A microcoil is placed close to the reservoir. A trace amount of sample is measured. This research is found in a report at monographic level. Microcoils and microprobes dedicated for microchips are at the research level. There is almost no application to synthesis.

(2) Flow NMR

Reaction reagents are mixed and reacted using a static mixer or the like. The reaction liquid is introduced to a flow NMR probe via a line, and NMR measurements are performed. This research is at a practical level. The flow NMR probe is necessary for the measurements. The long distance from the reaction portion to the portion inside the NMR magnet irradiated with an RF magnetic field is a disadvantage.

(3) Microchip-MS

As shown in FIG. 3, when a microchip is fabricated, a nanoelectrospray nozzle is integrated with the microchip. Mass analysis is enabled by applying a high voltage to the nozzle. This technique finds wider applications in biochemical applications than in synthesis chemistry.

REFERENCES

Japanese Utility-Model Laid-Open No. S57-75558;
Published Technical Report 2004-502547 of Japan Institute of Invention and Innovation;
J. H. Walton et al., *Analytical Chemistry*, Vol. 75, pp. 5030-5036 (2003); and
J. Kamaeoka et al., *Analytical Chemistry*, Vol. 74, pp. 5897-5901 (2003).

In the case of a microchip used in an NMR instrument to analyze reactions, the chip has the following fundamental components: two raw material inlet ports 1A and 1B for introducing two liquids, a mixer portion 2 for mixing the two liquids introduced, a detector portion 3 for passing the mixture through a serpentine channel in the NMR measurement portion, and a waste port 4 for discharging the measured reaction liquid as shown in FIG. 4 (see Japanese Utility Model Laid-Open No. S57-75558).

However, the prior art microchip for analysis of reactions has the following limitations. (1) The length of the channel through which the reaction liquid flows is fixed. (2) Since the channel is very thin, the flow rate is limited by the performance of the pump that introduces the reaction liquid. For these and other reasons, there is the problem that the elapsed time (reaction time) taken to reach a measurement after mixing of the two liquids cannot be varied greatly. Consequently, prior art microchips for analysis of reactions cannot be used for research on reaction kinetics.

SUMMARY OF THE INVENTION

In view of the foregoing, it is an object of the present invention to provide a microchip which can make variable the elapsed time (reaction time) to a measurement after mixing of two liquids and which can be used for research on reaction kinetics.

This object is achieved by a microchip reactor according to the present invention, the microchip comprising a base portion and a movable portion. The base portion includes a first glass plate and a second glass plate. Grooves are formed in a surface of the first glass plate. A liquid inlet port and a liquid exit port are formed at desired positions in a surface of the second glass plate which are opposite to the grooves. The first and second glass plates are bonded together to form a flow channel. The movable portion includes a third glass plate and a fourth glass plate. Grooves are formed in a surface of the third glass plate. A liquid inlet port and a liquid exit port are formed at desired positions in a surface of the fourth glass plate which are opposite to the grooves in the third plate. The third and fourth glass plates are bonded together to form a flow channel.

The base portion and the movable portion have contact surfaces which are slidably in contact with each other and which intersect the bonded surfaces of the glass plates. Different reagents are introduced into the channels in the base portion and movable portion which intersect in their downstream channel portions. The reagents are mixed and reacted in the intersection of the downstream portions of the channels. The position of the intersection is determined by a point where an opening and a slot intersect. The opening is formed in the sliding contact surface of the movable portion. The slot is formed in the sliding contact surface of the base portion. The major axis of the slot is in the direction of sliding motion of the movable portion.

According to one embodiment, the base portion is a microchip consisting of the first and second glass plates bonded together by thermocompression.

According to another embodiment, the movable portion is a microchip subassembly consisting of the third and fourth glass plates bonded together by thermocompression. Each of the glass plates has a thickness of 1 to 5 mm.

Preferably, the grooves have been machined to a depth of 50 to 500 μm. The grooves, liquid inlet ports, and liquid exit ports may be formed or machined by a wet etching technique or drilling technique.

Preferably, the glass sheets for guiding the movable portion are stuck to the front and rear surfaces, respectively, of the base portion.

The base portion may have a detection portion to be used in combination with an analytical instrument for analyzing the reaction liquid. In one aspect of the present invention, the analytical instrument is an NMR spectrometer. In another aspect of the present invention, the analytical instrument is an ESR spectrometer.

In a further aspect of the present invention, each of the glass plates may be made of quartz glass.

In a yet other aspect of the invention, the analytical instrument is a mass spectrometer, and the detection portion is an electrospray nozzle to be used in combination with the mass spectrometer that analyzes the reaction liquid.

According to a preferred embodiment, the microchip reactor according to the present invention comprises (i) the base portion having the first and second glass plates and (ii) the movable portion having the third and fourth glass plates. A surface of the first glass plate is provided with the grooves. The liquid inlet port and the liquid exit port are formed at desired positions in the second glass plate which are opposite to the grooves. The first and second glass plates are bonded together to form the flow channel. A surface of the third glass plate is provided with the grooves. The liquid inlet port and liquid exit port are formed at desired positions in the fourth glass plate which are opposite to the grooves in the third plate. The third and fourth glass plates are bonded together to form the flow channel. The base portion and the movable portion have the contact surfaces which are slidably in contact with each other and which intersect the bonded surfaces of the glass plates. Different reagents are introduced into the channels in the base and movable portions which meet in their downstream channel portions. When the different reagents are mixed and reacted at the downstream intersection, the position of the intersection is determined by the intersection of the opening and the slot. The opening is formed in the sliding contact surface of the movable portion. The slot is formed in the sliding contact surface of the base portion. The major axis of the slot is in the direction of sliding motion of the movable portion. Therefore, a microchip reactor which can vary the time (reaction time) elapsed until a measurement is made since mixing of two liquids and which can be used for research on reaction kinetics is provided.

Other objects and features of the invention will appear in the course of the description thereof, which follows.

BRIEF DESCRIPTION OF THE DRAWINGS

FIGS. 5A and 5B show side elevations of a microchip according to one embodiment of the present invention, the microchip being for use in NMR; and FIGS. 6A, 6B and 6C show side elevations of the microchip shown in FIGS. 5A and 5B, as viewed from other directions, as well as a cross section of the microchip.

DESCRIPTION OF THE PREFERRED EMBODIMENTS

Figure 1A:
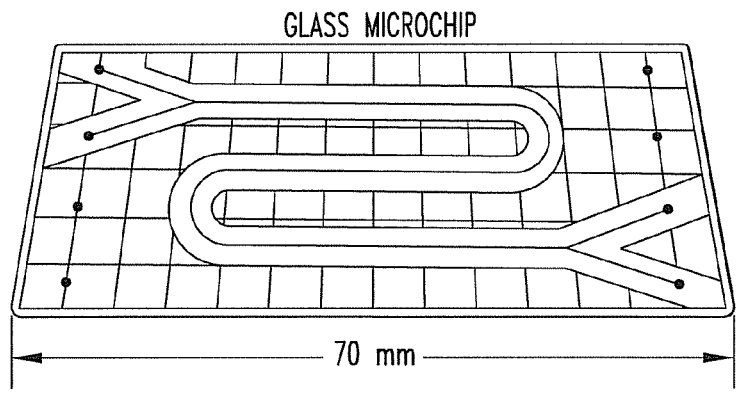
FIGS. 1A, 1B and 1C show a commercially available microchip, microchip holder, as well as a schematic cross section of a connector.
Figure 1B:
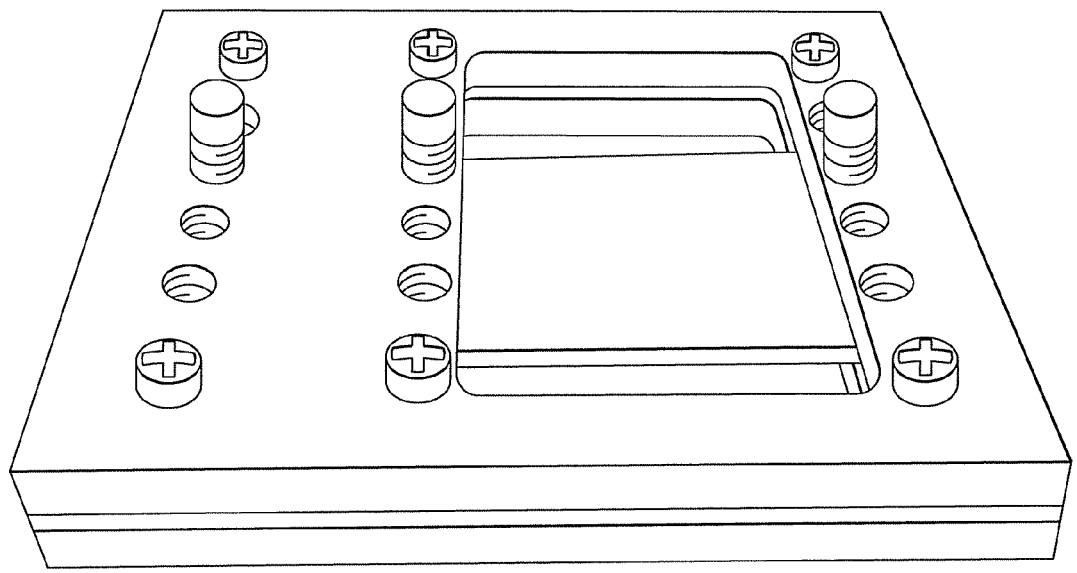
Figure 1C:
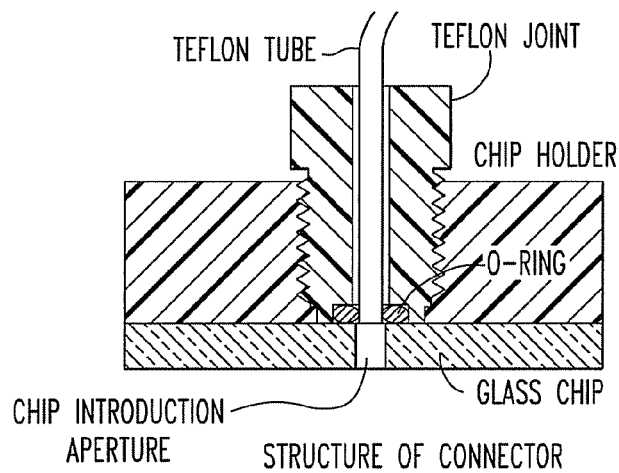
Figure 2:
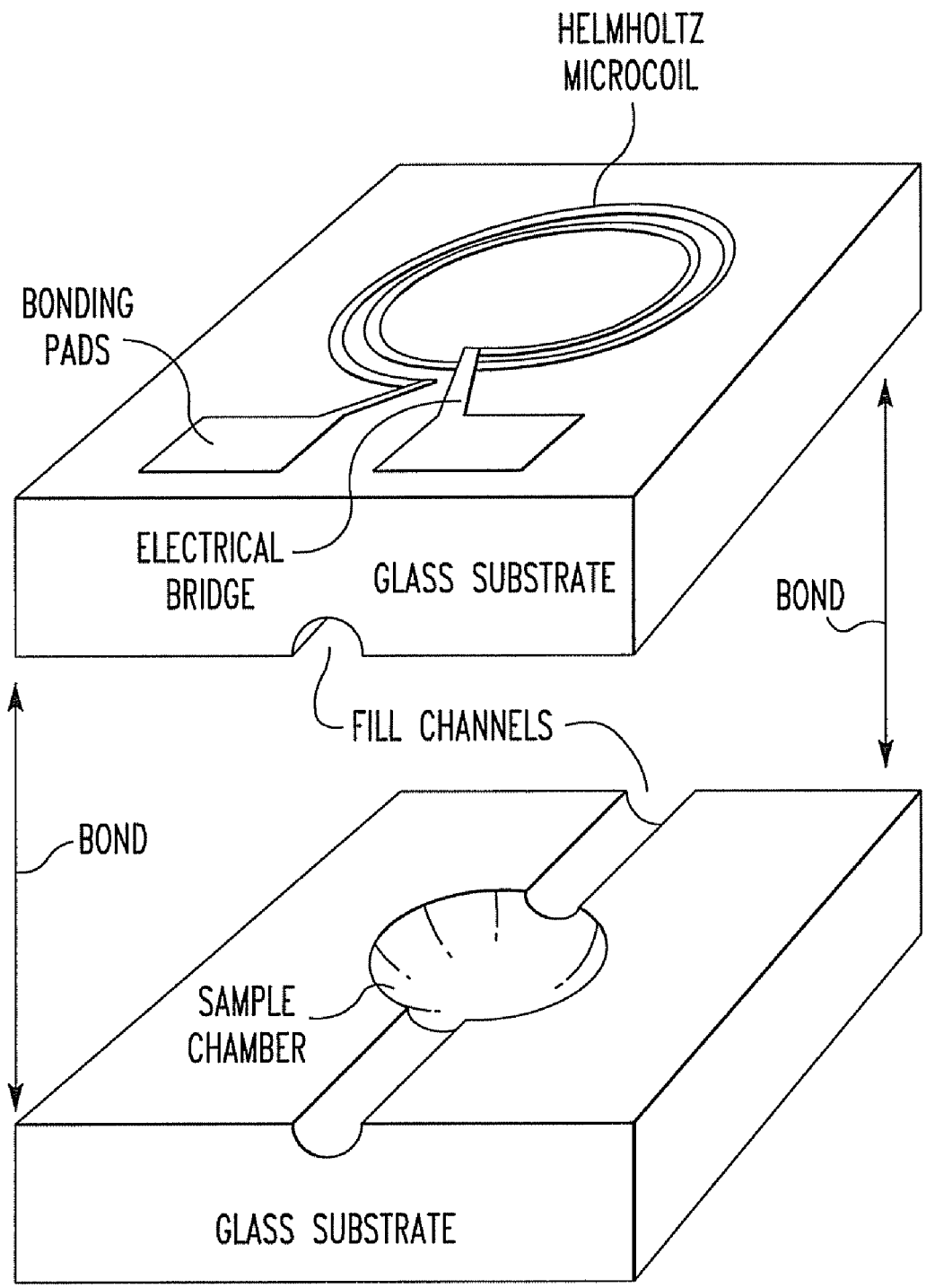
FIG. 2 shows perspective views of a prior art microchip applied to an NNR spectrometer.
Figure 3:
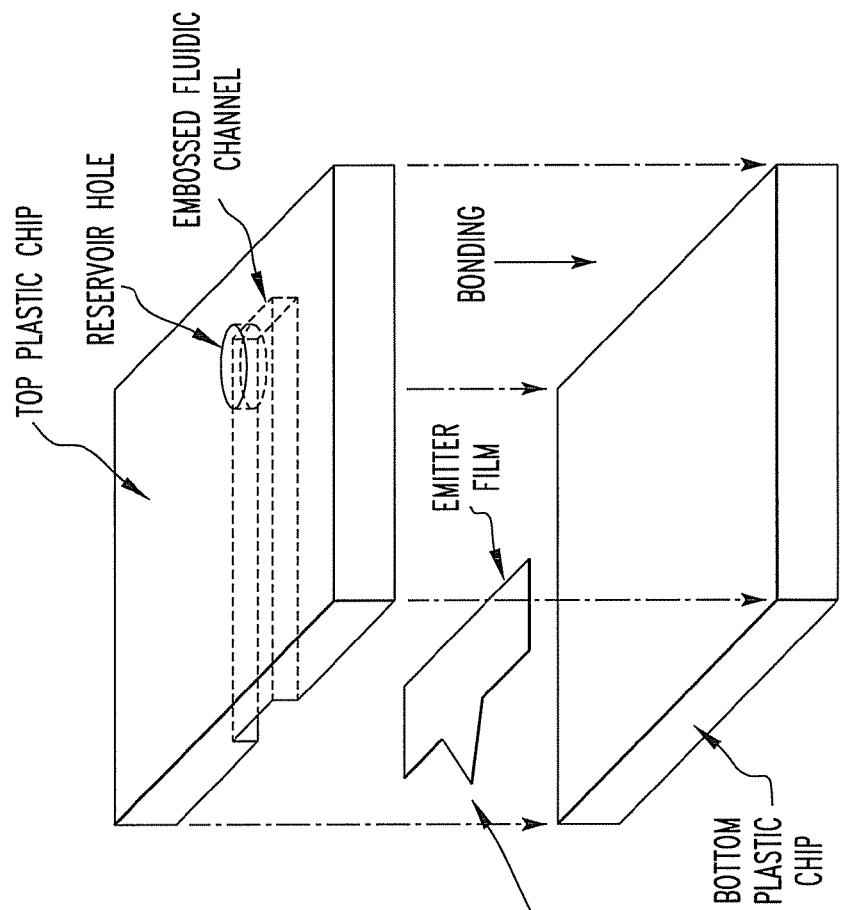
FIG. 3 shows perspective views of a prior art microchip applied to a mass spectrometer, as well as a schematic cross section of a nanoelectrospray nozzle used in the microchip.
Figure 3:
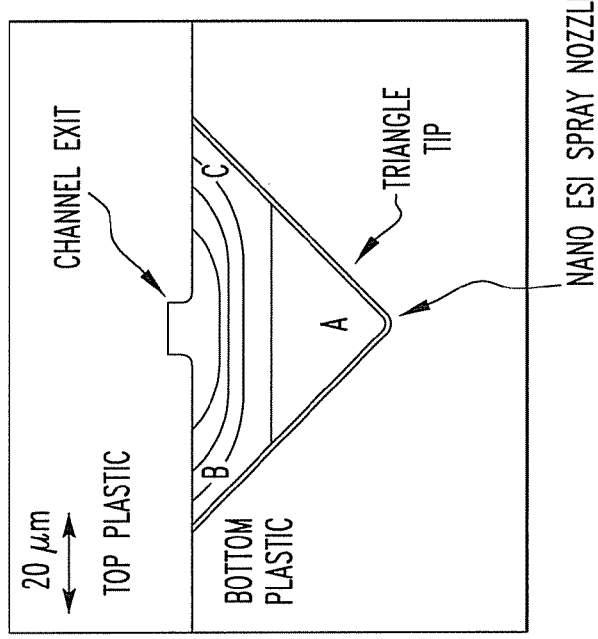
Figure 4:
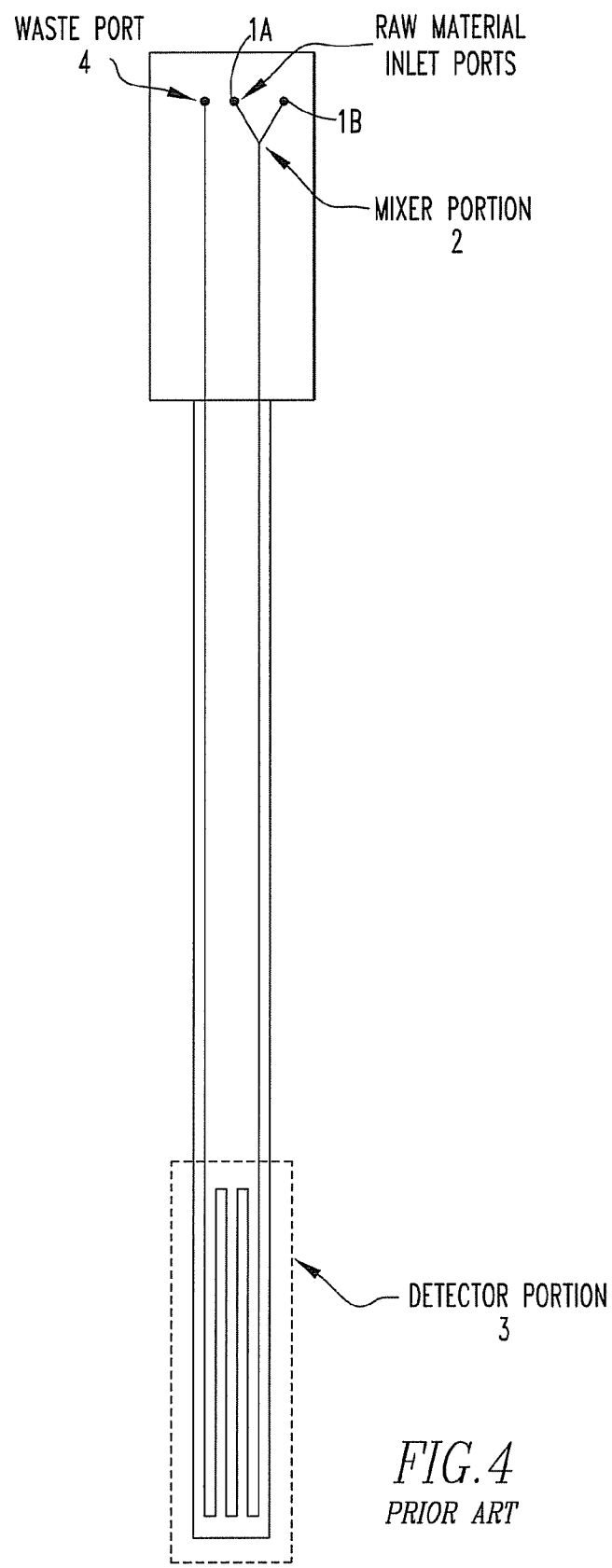
FIG. 4 is a side elevation of a prior art microchip for use in NMR.

An embodiment of the present invention is hereinafter described with reference to the drawings.

FIGS. 5A and 5B show a microchip for use in an NMR device, the microchip being built according to one embodiment of the present invention. As shown in FIGS. 5A and 5B, the microchip consists essentially of two raw material inlet ports 1A and 1B for introducing two liquids, a mixer portion 2 for mixing the introduced two liquids, a detector portion 3 for passing the mixture through a serpentine channel in the NMR measurement portion, and a waste port 4 for discharging the measured reaction liquid.

The microchip has a body portion made of a base portion 5 and a movable portion 6. The body portion is fabricated by bonding together at least two glass plates each having a thickness of 1 to 5 mm. The body portion contains one reagent inlet port, the detector portion and the exhaust port. The movable portion contains the other reagent inlet port. In particular, grooves are formed in the surface of the first glass plate to a depth of 50 to 500 μm by a wet etching technique or drilling technique. A liquid inlet port and a liquid exit port are formed in the surface of the second glass plate at desired positions opposite to the grooves in the first plate by a wet etching technique or drilling technique. The first and second glass plates are bonded together by thermocompression.

The difference of the microchip according to the present embodiment compared with the prior art microchip used for reaction kinetics analysis is that the distance from the sample inlet port 1A to the mixer portion 2, that is, where the conduits loading from both reagent inlet ports are joined, and the distance from the mixer portion 2 to the detector portion 3 are variable. This is achieved by making movable both the channel from the sample inlet port 1A to the mixer portion 2 and the channel from the sample inlet port 1B to the mixer portion 2, which, in turn, is realized by sliding motion between the base portion 5 and the movable portion 6.

In particular, as shown in FIG. 6A, a rectilinear slot 8 through which a first reagent entered from the sample inlet port 1A is formed from point A to point B in the contact surface 7A of the base portion 5 which makes sliding contact with the contact surface 7B of the movable portion 6. The sliding contact surface 7A of the base portion 5 and movable portion 6 extend perpendicular to the bonded surfaces of the glass plates. The contact surface of the base portion 5 and the contact surface of the movable portion 6 are in sliding contact with each other. An opening 9 is formed in point C in the movable portion 6 that is opposite to the slot 8. A second reagent introduced from the sample inlet port 1B flows out from this opening 9. At the point C, which both channels intersect, the first and second reagents are mixed. Point C can be shifted by sliding the opening 9 in the movable portion 6 between the points A and B along the sliding contact surface 7A of the base portion 5 and movable portion 6 (see FIG. 6C).

The position of the point C at which mixing takes place is determined by the intersection of the opening 9 formed in the sliding contact surface of the movable portion 6 and the slot 8 formed in the sliding contact surface of the base portion 5. The major axis of the slot 8 is in the direction of sliding motion of the movable portion 6.

As described previously, the width and depth of the slot 8 are 50 to 500 μm. The slot 8 is formed by a wet etching technique or drilling technique. The design and machining method can be modified according to the circumstances.

In the present embodiment, the two microchip subassemblies, i.e., base portion and movable portion, each of which is made of two glass plates bonded together by thermocompression, are permitted to make smooth sliding motion relative to each other. For this purpose, glass sheets 10A and 10B are stuck to each of the front and rear surfaces of the base portion 5. The glass sheets 10A and 10B act to guide the sliding contact surface 7B of the movable portion 6 along the sliding contact surface 7A of the base portion 5.

FIG. 5A shows the state in which the mixing position at which both reagents are mixed has been shifted toward the detector portion 3. FIG. 5B shows the state in which the mixing position has been shifted toward the reagent inlet port 1. In the state shown in FIG. 5A, the mixing position C is closer to the detector portion 3 and so the sample reaches the detector portion 3 in a relatively short time after mixing of both reagents. On the other hand, in the state shown in FIG. 5B, the mixing position C at which both reagents are mixed is remote from the detector portion 3 and so the sample reaches the detector portion 3 in a longer time after mixing of both reagents. It is possible to perform reaction kinetics analysis of the sample by making use of the difference between both times.

The present embodiment has been configured taking account of use in an NMR spectrometer. The present embodiment can be applied to other magnetic resonance spectrometers, such as an ESR spectrometer. Where the present embodiment is used in an ESR instrument, quartz glass is preferably used as the raw material to avoid appearance of background signal.

Furthermore, the present embodiment can also be applied to a mass spectrometer if the serpentine detector portion 3 is replaced by a nanoelectrospray nozzle.

The present invention can be widely applied to research on reaction kinetics of organic synthesis reactions.

Having thus described my invention with the detail and particularity required by the Patent Laws, what is desired protected by Letters Patent is set forth in the following claims.

The invention claimed is:

1. A microchip reactor comprising:
   a base portion including a first glass plate and a second glass plate bonded together to form a first longitudinal flow channel, the first glass plate having a groove in its one surface, the second glass plate having a liquid inlet port and a liquid exit port formed at desired positions in communication with the first flow channel; and
   a movable portion including a third glass plate and a fourth glass plate bonded together to form a second flow channel, the third glass plate having a groove in its one surface, the fourth glass plate having a liquid inlet port at a desired position in communication with the second flow channel in the third glass plate,
   wherein said base portion and said movable portion have respective sliding contact surfaces which are slidably in contact with each other,
   wherein said base portion and said movable portion have respective downstream channel portions meeting each other at an intersection at variable locations along the length of the first flow channel where different reagents are introduced, mixed, and reacted, and
   wherein the position of the intersection is determined by an intersection between an opening in communication with said second flow channel, said opening formed in the sliding contact surface of the movable portion and a slot formed in the sliding contact surface of the base portion, the slot being in communication with said first flow channel, said slot having a major axis in the direction of sliding motion of the movable portion.

2. A microchip reactor as set forth in claim 1, wherein said base portion is a microchip subassembly made of the first and second glass plates bonded together by thermal compression.

3. A microchip reactor as set forth in claim 1, wherein said movable portion is a microchip subassembly made of the third and fourth glass plates bonded together by thermal compressions.

4. A microchip reactor as set forth in claim 1, wherein each of the glass plates has a thickness of 1 to 5 mm.

5. A microchip reactor as set forth in claim 1, wherein said grooves have been machined to a depth of 50 to 500 μm.

6. A microchip reactor as set forth in claim 1, wherein said grooves, liquid inlet ports, and liquid exit ports have been machined by a wet etching technique or drilling technique.

7. A microchip reactor as set forth in claim 1, wherein glass sheets for guiding the movable portion are stuck to front and rear surfaces, respectively, of said base portion.

8. A microchip reactor as set forth in claim 1, wherein said base portion has a detector portion that is used in combination with an analytical instrument for analyzing reaction liquids.

9. A microchip reactor as set forth in claim 8, wherein said analytical instrument is an NMR spectrometer.

10. A microchip reactor as set forth in claim 8, wherein said analytical instrument is an ESR spectrometer.

11. A microchip reactor as set forth in claim 10, wherein each of said glass plates is made of quartz glass.

12. A microchip reactor as set forth in claim 8, wherein said analytical instrument is a mass spectrometer, and wherein said detector portion is an electrospray nozzle used in combination with the mass spectrometer for analyzing the reaction liquids.

* * * * *